(12) United States Patent
Riedel et al.

(10) Patent No.: US 10,454,069 B2
(45) Date of Patent: Oct. 22, 2019

(54) OLED WITH VARIABLE THICKNESS ORGANIC FUNCTIONAL LAYER

(71) Applicant: OSRAM OLED GmbH, Regensburg (DE)

(72) Inventors: Daniel Riedel, Regensburg (DE); Thomas Wehlus, Lappersdorf (DE); Carola Diez, Regensburg (DE); Nina Riegel, Tegernheim (DE); Ulrich Niedermeier, Lieblfing (DE); Arne Fleißner, Regensburg (DE); Erwin Lang, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 39 days.

(21) Appl. No.: 15/120,392

(22) PCT Filed: Feb. 18, 2015

(86) PCT No.: PCT/EP2015/053417
§ 371 (c)(1),
(2) Date: Aug. 19, 2016

(87) PCT Pub. No.: WO2015/124629
PCT Pub. Date: Aug. 27, 2015

(65) Prior Publication Data
US 2017/0229675 A1 Aug. 10, 2017

(30) Foreign Application Priority Data
Feb. 20, 2014 (DE) .................. 10 2014 102 191

(51) Int. Cl.
*H01L 51/52* (2006.01)
*H01L 51/50* (2006.01)
(Continued)

(52) U.S. Cl.
CPC ...... *H01L 51/5265* (2013.01); *H01L 51/0011* (2013.01); *H01L 51/504* (2013.01);
(Continued)

(58) Field of Classification Search
CPC ............ H01L 51/5265; H01L 51/0011; H01L 51/504; H01L 51/5056; H01L 51/5072;
(Continued)

(56) References Cited

U.S. PATENT DOCUMENTS 8,212,245 B2 7/2012 Birnstock et al.
8,878,164 B2 11/2014 Gather et al.
(Continued)

FOREIGN PATENT DOCUMENTS

CN 101222026 A 7/2008
CN 103531716 A 1/2014
(Continued)

OTHER PUBLICATIONS

Wang et al., "Improved viewing characteristics of red emission top-emitting organic light-emitting devices by integrating grating", Optical Engineering Letters, vol. 52(8), 080502 (2013).*
(Continued)

*Primary Examiner* — Peter Bradford
(74) *Attorney, Agent, or Firm* — Slater Matsil, LLP (57) ABSTRACT

An organic light-emitting device and a method for producing an organic light emitting device are disclosed. In an embodiment the device includes a substrate and at least one layer sequence arranged on the substrate and suitable for generating electromagnetic radiation. The at least one layer sequence includes at least one first electrode surface arranged on the substrate, at least one second electrode surface arranged on the first electrode surface and an organic functional layer stack having organic functional layers between the first electrode surface and the second electrode
(Continued)

surface. The organic functional layer stack includes at least one organic light-emitting layer, wherein the at least one organic light-emitting layer is configured to emit light, wherein the organic functional layer stack includes at least one inhomogeneity layer, and wherein a thickness of the at least one inhomogeneity layer varies in a lateral direction.

17 Claims, 6 Drawing Sheets

(51) Int. Cl.
    *H01L 51/00*      (2006.01)
    *H01L 51/56*      (2006.01)
(52) U.S. Cl.
    CPC ...... *H01L 51/5056* (2013.01); *H01L 51/5072* (2013.01); *H01L 51/5206* (2013.01); *H01L 51/5221* (2013.01); *H01L 51/56* (2013.01); *H01L 2251/558* (2013.01)
(58) Field of Classification Search
    CPC . H01L 51/5206; H01L 51/5221; H01L 51/56; H01L 2251/558
    See application file for complete search history.

(56) References Cited

U.S. PATENT DOCUMENTS

| | | |
|---|---|---|
| 9,224,974 B2 | 12/2015 | Diekmann et al. |
| 9,385,338 B2 | 7/2016 | Wehlus et al. |
| 2009/0051275 A1 | 2/2009 | Kobayashi et al. |
| 2011/0073844 A1* | 3/2011 | Pieh .................... H01L 51/5036 257/40 |
| 2011/0114932 A1 | 5/2011 | Birnstock et al. |
| 2013/0175550 A1* | 7/2013 | Song .................... H01L 51/0013 257/88 |
| 2013/0240852 A1 | 9/2013 | Yamazaki |
| 2013/0252364 A1* | 9/2013 | Kawato .................... C23C 14/12 438/46 |
| 2014/0159022 A1* | 6/2014 | Song .................... H01L 27/3248 257/40 |
| 2015/0179987 A1* | 6/2015 | Ma ........................ H01L 51/003 257/40 |

FOREIGN PATENT DOCUMENTS

| | | |
|---|---|---|
| DE | 102008023035 A1 | 11/2009 |
| DE | 102008054435 A1 | 6/2010 |
| DE | 102009055060 A1 | 6/2011 |
| DE | 102012203466 A1 | 9/2013 |
| JP | 2002246178 A | 8/2002 |
| WO | 2005081334 A1 | 9/2005 |
| WO | 2009135466 A1 | 11/2009 |

OTHER PUBLICATIONS

Zhou et al., "Double light-emitting layer implementing three-color emission: Using DCJTB lightly doping in Alq3 as red-green emitting layer and APEAn1N as blue-green emitting layer", Journal of Luminescence, 196, 40 (2018).*

Liu, Y. et al., "Omnidirectional emission from top-emitting organic light-emitting devices with microstructured cavity," Optics Letters, vol. 37, No. 2, Jan. 15, 2012, pp. 124-126.

* cited by examiner

OLED WITH VARIABLE THICKNESS ORGANIC FUNCTIONAL LAYER

This patent application is a national phase filing under section 371 of PCT/EP2015/053417, filed Feb. 18, 2015, which claims the priority of German patent application 10 2014 102 191.6, filed Feb. 20, 2014, each of which is incorporated herein by reference in its entirety.

TECHNICAL FIELD

An organic light-emitting device is specified.

BACKGROUND

In organic light-emitting diodes (OLEDs) only a portion of the light generated is outcoupled directly. The remaining light produced in the active region is distributed to different loss channels, thus in light, for instance, which is carried in the substrate, in a transparent electrode and in organic layers due to waveguide effects, and in surface plasmons, which can be produced in a metal electrode. The waveguide effects occur in particular due to the differences in the refractive index at the boundaries between the individual layers and regions of an OLED. In known OLEDs only roughly a quarter of the light generated in the active region is typically outcoupled into the environment, thus air, for example, while roughly 25% of the light produced is lost for radiation due to wave guidance in the substrate, roughly 20% of the light produced is lost due to wave guidance in a transparent electrode and the organic layers and roughly 30% is lost due to the generation of surface plasmons in a metal electrode.

Furthermore, the effect of the aforementioned loss mechanisms differs depending on the spectral proportion of the radiated light that is considered. The loss in a first spectral sub-region of the emitted light can thus be greater than in a second sub-region. The organic layer stack of an OLED can be viewed as a microcavity, in which a layer generating organic light is embedded, in which light emission takes place due to luminescence when an external voltage is applied. The geometrical boundary conditions in the microcavity cause certain sub-regions of the emitted spectrum to be suppressed or even completely cut off, so that effectively other sub-regions of the spectrum are emphasized in the radiated light. This can result in an undesirable reduction in the Color Rendering Index (CRI).

Take the influence of the distance of the organic light-emitting layer from a reflectively formed electrode surface as an example. In the event of a change in the distance due to increasing or decreasing the layer thickness of the layers arranged in between, the position and width of the spectral sub-regions that are suppressed or enhanced in the radiated light change, so that a different radiation characteristic of the component is yielded.

To enhance the Color Rendering Index, measures are known, for example, to adjust and optimize the spectrum of the radiated light by suitable positioning of the light-emitting layer in the microcavity. Furthermore, the addition of additional light-emitting layers, which ensure additional emission in individual, limited wavelength ranges, can enhance the Color Rendering Index. The manufacture is particularly elaborate, however, and can only be realized by the use of a cluster device. As well as this, such a procedure is accompanied by a rise in the required operating voltage.

SUMMARY OF THE INVENTION

Embodiments provide an organic light-emitting device that has an improved Color Rendering Index. According to at least one embodiment, an organic light-emitting device has a substrate and at least one layer sequence arranged on the substrate that is suitable for generating electromagnetic radiation. The layer sequence suitable for generating electromagnetic radiation comprises at least one first electrode surface arranged on the substrate, at least one second electrode surface arranged on the first electrode surface, and an organic functional layer stack with organic functional layers between the first electrode surface and the second electrode surface. The layer stack comprises in this case at least one organic light-emitting layer. It is provided that the organic functional layer stack has at least one inhomogeneity layer, the thickness of which varies in a lateral direction.

An inhomogeneity layer is always understood here and below to mean a layer of which the thickness varies in a lateral direction. A lateral direction is understood in this case to mean in particular a direction parallel to a main extension plane of the substrate and/or of the organic light-emitting layer. By analogy, a vertical direction is understood to mean in particular a direction perpendicular to a main extension plane of the substrate and/or the organic light-emitting layer. A thickness of the inhomogeneity layer is also understood to mean in particular its diameter in a vertical direction. The thickness of the inhomogeneity layer varying in a lateral direction causes a modification of the geometrical boundary conditions in regions in the microcavity, so that certain sub-regions of the emitted spectrum are less suppressed and/or a complete cut-off is prevented compared with the case of a homogeneous thickness of the relevant layer.

For example, a first sub-region of the device can be present in which the inhomogeneity layer has a certain thickness at which the suppression described above of a certain sub-region of the emitted spectrum occurs. To compensate, however, a second sub-region of the device can be present in which the inhomogeneity layer has another thickness, in which the same sub-region of the emitted spectrum is suppressed less or not at all. In general, the radiation of certain color portions can be preferred or reduced by varying the thickness of the inhomogeneity layer, due to which the spectrum of the emitted light can be adjusted as desired. In particular, the Color Rendering Index can be advantageously enhanced due to the effect of the inhomogeneity layer.

According to at least one embodiment of the device, it is provided that the inhomogeneity layer is different from the organic light-emitting layer. In this case the organic light-emitting layer can be formed homogeneously and have a uniform thickness.

According to at least one embodiment of the device, it is provided that the thickness of the inhomogeneity layer varies by at least 5 nm, preferably by at least 10 nm, especially preferably by at least 20 nm. Even at variations of 5 nm an enhancement of the Color Rendering Index can be observed, while this effect is amplified even further with greater variations. The thickness also preferably varies by less than 100 nm, especially preferably by less than 50 nm.

According to at least one embodiment of the device, it is provided that the thickness of the inhomogeneity layer varies periodically in a lateral direction. For example, at least one of the main surfaces of the inhomogeneity layer can have an undulating contour. Such a formation can be achieved simply, for example, in that the inhomogeneity layer lies on layers that for their part have an periodically formed surface contour.

According to at least one embodiment of the device, it is provided that the thickness of the inhomogeneity layer varies continuously. The thickness of the inhomogeneity layer can vary gradually, for example. The thickness preferably varies in each step of 5 nm in a lateral direction by less than 5 nm, preferably by less than 2 nm, especially preferably by less than 1 nm. Due to such a gradual, continuous and steady layer thickness progression, softer transitions are achieved between the spectral portions emitted by the different sub-regions of the device. Scattering of the light at any edges or steps of the inhomogeneity layer is also prevented.

The electrode surfaces can be formed on a large scale in each case. Extensive radiation of the light generated in the at least one organic light-emitting layer can be facilitated by this—in particular in contrast to a display in which the electrode surfaces are structured. "Large scale" can mean here that the electrode surfaces have an area of greater than or equal to one square millimeter, preferably greater than or equal to one square centimeter and especially preferably greater than or equal to one square decimeter.

According to at least one embodiment of the device, the first and/or the second electrode surface is formed to be translucent. "Translucent" here and below describes a layer that is permeable for visible light. In this case the translucent layer can be transparent, thus clearly transparent, or at least partially light-scattering and/or partially light-absorbing, so that the translucent layer can also be diffusely or milkily transparent. It is especially preferable if a layer described here as translucent is formed to be as transparent as possible, so that in particular the absorption of light is as low as possible.

According to another especially preferred embodiment, the substrate is formed translucently and the translucently formed first electrode surface is arranged between the translucent substrate and the organic functional stack, so that in the at least one organic light-emitting layer, light that is generated can be radiated through the first electrode surface and the translucent substrate. An organic light-emitting device of this kind can also be described as a so-called "bottom emitter". For example, the substrate can have one or more materials in the form of a layer, a plate, a film or a laminate, which are selected from glass, quartz, plastic, metal, silicon wafer. It is especially preferable for the substrate to have glass, for example in the form of a glass layer, glass film or glass plate, or to be made from this.

According to another especially preferable embodiment, the second electrode surface is formed translucently, so that in the at least one organic light-emitting layer, light that is generated can be radiated through the second electrode surface. An organic light-emitting device of this kind can also be described as a so-called "top emitter". However, the organic light-emitting device can also be formed at the same time as a "bottom emitter" and "top emitter".

Furthermore, an encapsulation arrangement can also be arranged over the electrode surfaces and the organic layers. The encapsulation arrangement can be executed in the form of a glass lid, for example, or preferably in the form of a thin-layer encapsulation.

According to at least one embodiment of the device, it is provided that the first electrode surface or the second electrode surface is formed reflectively and the inhomogeneity layer is arranged between the organic light-emitting layer and the reflectively formed first or second electrode surface. Due to the laterally varying thickness of the inhomogeneity layer, the vertical distance of the organic light-emitting layer from the reflectively formed electrode surface also changes over a lateral extension of the device. As described above, with the continuous variation of the distance between the organic light-emitting layer and the reflectively formed first or second electrode surface due to an increase or reduction in the layer thickness of the layers arranged in between, the position and width of the spectral sub-regions suppressed or amplified in the radiated light change, so that a laterally varying radiation characteristic of the device results, which leads overall to an enhancement of the Color Rendering Index.

According to another embodiment, the translucent electrode surface is executed as an anode and can thus serve as a material injecting holes. The other, preferably reflectively formed electrode surface is then formed as a cathode. Alternatively to this, the translucent electrode surface can also be executed as a cathode and thus serve as a material injecting electrons. The other, preferably reflectively formed electrode surface is then formed as an anode.

The translucently formed electrode surface can have a transparent conductive oxide, for example, or consist of a transparent conductive oxide. Transparent conductive oxides (abbreviation "TCO") are transparent, conductive materials, usually metal oxides such as zinc oxide, tin oxide, cadmium oxide, titanium oxide, indium oxide or indium tin oxide (ITO).

According to another embodiment, the reflectively formed electrode surface has a metal, which can be chosen from aluminum, barium, indium, silver, gold, magnesium, calcium and lithium as well as compounds, combinations and alloys. The reflective electrode surface has particularly preferably a reflectivity of greater than or equal to 80% in the visible spectral region.

According to at least one embodiment of the device, it is provided that the organic functional layers have an organic hole conducting layer or an organic electron conducting layer.

According to at least one embodiment of the device, it is provided that the inhomogeneity layer is an organic hole conducting layer, in particular a hole transport layer, or an organic electron conducting layer, in particular an electron transport layer. Since the voltage drop at the hole conducting layer or the electron conducting layer is only dependent on the layer thickness to a small extent, these layers are suitable for adjusting the properties of the microcavity, which can be done sufficiently independently of the operating voltage. It is thus possible to achieve an optimization of the microcavity by adjusting the thickness of these layers without excessively influencing the electrooptical properties of the remaining layer stack.

The organic functional layers between the two electrode surfaces, thus the hole conducting layer, the organic light-emitting layer and the electron conducting layer, for example, can have organic polymers, organic oligomers, organic monomers, organic small, non-polymer molecules or low-molecular compounds ("small molecules") or combinations of these.

According to another embodiment, the layer conducting the charge carriers, thus the electron conducting layer or the hole conducting layer, has a dopant. An increase in the conductivity and a reduction in the voltage drop on the layer conducting the charge carriers are achieved by this. For example, an electron transport layer formed as an inhomogeneity layer can have a dopant, due to which the voltage drop on the inhomogeneity layer is predominantly independent of the layer thickness, so that the laterally varying thickness does not have too detrimental an effect on the operating voltage necessary to operate the device.

According to another embodiment, the hole conducting layer has at least one hole injection layer, one hole transport layer or a combination of these. In particular, both doped layers of molecular compounds and of electrically conductive polymers are possible as a hole transport or hole injection layer. For example, tertiary amines, carbazole derivatives, conductive polyaniline or polyethylenedioxythiophene can prove advantageous as materials in particular for a hole transport layer.

According to another embodiment, the electron conducting layer has at least one electron injection layer, one electron transport layer or a combination of these. For example, the electron conducting layer can have an electron transport layer, which has, for example, 2,9-Dimethyl-4,7-diphenyl-1,10-phenanthroline (BCP) or 4,7-Diphenyl-1,10-phenanthroline (BPhen). This material can preferably have a dopant that is selected from Li, $Cs_2CO_3$, $Cs_3Po_4$ or a molecular doping.

According to another embodiment, the light-emitting layer has an electroluminescent material and is particularly preferably executed as an electroluminescent layer or electroluminescent layer stack. Materials suitable for this are materials that have a radiation emission based on fluorescence or phosphorescence, for example polyfluorene, polythiophene or polyphenylene or derivatives, compounds, mixtures or copolymers of these.

In addition to the organic hole conducting layer, the at least one organic light-emitting layer and the organic electron conducting layer, one or more other organic layers can be present in the organic functional layer stack. In particular, a hole blocking layer can be arranged between the electron conducting layer and the light-emitting layer. It is also possible for an electron blocking layer to be arranged between the hole conducting layer and the light-emitting layer. One of the last-named layers can also form the inhomogeneity layer.

According to another embodiment, a plurality of light-emitting layers are arranged between the first and the second electrode surface, wherein the light-emitting layers are formed to generate electromagnetic radiation from wavelength regions that are different from one another. In this embodiment the enhancement of the Color Rendering Index achieved by the inhomogeneity layer is especially advantageous.

The plurality of light-emitting layers can form a layer stack in this case. Furthermore, it is also possible that an electron conducting layer and a hole conducting layer respectively are arranged between adjacent light-emitting layers. The organic light-emitting device can have in particular at least two or more functional layer stack units, which each have at least one organic electron conducting layer and one organic hole conducting layer with an organic light-emitting layer arranged in between. The functional layer stack units can be connected in series in such a manner that an electron conducting layer of one layer stack unit adjoins a hole conducting layer of an adjacent layer stack unit or vice-versa. Such a combination of adjacent electron and hole conducting layers, between which an undoped layer functioning as a charge carrier production zone can also be arranged, can also be described as a so-called "charge generation layer" (CGL).

The at least one organic light-emitting layer in the form of a single light-emitting layer or a plurality of light-emitting layers can especially preferably radiate visible light in a narrow or wide wavelength range, thus monochrome or multicolored or, for example, even white light. To do this, the at least one organic light-emitting layer can have one or more organic light-emitting materials in the form of a single layer or a plurality of light-emitting layers. Multicolored or white light can be generated by the combination of various organic light-emitting materials in the at least one light-emitting layer.

In the case of a plurality of organic light-emitting layers, in particular layer stack units arranged above one another, the organic light-emitting layers can preferably be present in one of the following combinations:
one of the light-emitting layers emits red and green light, an optional further light-emitting layer emits blue light, at least two or three light-emitting layers are present, which all emit white light.

According to at least one embodiment of the device, it is provided that a thickness of the substrate varies in a lateral direction (for example by more than 200 nm, preferably by more than 1 μm, especially preferably by more than 5 μm). The laterally varying thickness of the substrate can advantageously be transferred to the layers arranged on the substrate and thus indirectly or directly to the inhomogeneity layer, which can at least partially have a contour progression like the substrate. Consequently, by the provision of an uneven substrate of this kind, the production of the inhomogeneity layer according to the invention is made easier, as when the layer stack is applied to the substrate, the desired lateral variation of the thickness of the inhomogeneity layer results virtually automatically.

According to at least one embodiment of the device, it is provided that the substrate has at least one elevation, which has a height of more than 200 nm, preferably more than 1 μm, especially preferably more than 5 μm. A plurality of elevations are preferably provided, which are offset laterally from one another and in this case have a spacing of more than 200 nm, preferably more than 1 μm, especially preferably more than 5 μm.

A method for the production of an organic light-emitting device comprises the method steps of provision of a substrate and application to the substrate of a layer sequence suitable for generating electromagnetic radiation. In this case the layer sequence is formed as described above and comprises in particular an organic functional layer stack, which has at least one inhomogeneity layer, the thickness of which varies in a lateral direction.

According to at least one embodiment of the method, it is provided that a substrate is provided, the thickness of which varies in a lateral direction and wherein the layer sequence suitable for generating electromagnetic radiation is applied to the substrate in such a way that at least one inhomogeneity layer is formed.

According to at least one embodiment of the method, it is provided that the organic functional layer stack is formed at least partly by vapor deposition.

According to at least one embodiment of the method, it is provided that different angles occur between a material flow occurring in the vapor deposition and the vertical direction. Even layers of a homogeneous thickness can be produced in this way on a level substrate.

According to at least one embodiment of the method, it is provided that during the formation of the inhomogeneity layer, a shadow mask used in vapor deposition is moved in a vertical direction, due to which various sub-regions of the inhomogeneity layer to be formed are exposed to various parts of the material flow occurring in the vapor deposition.

According to at least one embodiment of the method, it is provided that during the formation of the inhomogeneity layer, a shadow mask used in the vapor deposition is moved in a lateral direction, wherein the quantity of material deposited varies laterally. This can be achieved, for example, in that the shadow mask is moved laterally at a constant deposition rate at a temporally variable speed, or in that the deposition rate is varied timewise while the shadow mask is moved at a constant speed relative to the substrate. However, combinations of said measures are also conceivable.

According to at least one embodiment of the method, it is provided that a first part of the inhomogeneity layer is formed using a first mask with at least a first opening and a second part of the inhomogeneity layer is formed using a second mask with a plurality of openings, which are smaller than the first opening.

BRIEF DESCRIPTION OF THE DRAWINGS

Other advantages, advantageous embodiments and developments result from the exemplary embodiments described below in connection with the figures.

In the exemplary embodiments and figures, identical or similar elements or elements with the same effect can be provided with the same reference signs. The elements represented and their size ratios to one another should not be regarded as being to scale. On the contrary, individual elements, such as layers, components, devices and regions, can be represented as excessively large for better representation and/or for a better understanding.

DETAILED DESCRIPTION OF ILLUSTRATIVE EMBODIMENTS

Figure 1:
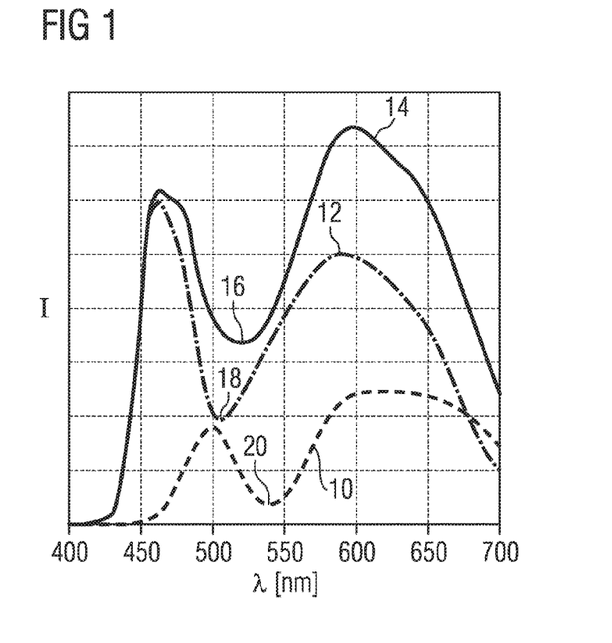
FIG. 1 shows the influence of the layer thickness of one of the layers arranged in the layer stack of an OLED, in this case the electron transport layer (ETL), on the light radiated by the device.

To understand the effect of the inhomogeneity layer provided according to the invention, the influence of the layer thickness of one of the layers arranged in the layer stack of an OLED, in this case the electron transport layer (ETL), on the light radiated by the device is shown in FIG. 1. The results of a simulation are shown in which an intensity of the light radiated by a device was calculated as a function of the emitted wavelength, wherein the device has an electron transport layer of a constant thickness.

The curve designated 10 represents the intensity curve in a device with an 80 nm thick electron transport layer. By comparison with this, the curve 12 represents the intensity curve in the case of an otherwise identically constructed device in which the thickness of the electron transport layer is 50 nm. It is clear that the two curves 10, 12 have maxima and minima at different wavelengths, wherein the maxima also exhibit different widths. In addition, in FIG. 1 the curve 14 represents a combination of the two individual spectra 10, 12, i.e. their sum. It is to be recognized that the curve 14 represents a much broader spectrum, since the minimum 16 is formed in a much less pronounced manner compared with the minima 18, 20 of the curves 10 and 12 and overall a larger wavelength range is present with a comparably high intensity. This corresponds in particular to an enhanced Color Rendering Index in comparison to the cases represented by the curve 10 and 12. The present invention makes use of the improvement in the radiated spectrum by the combination of different individual spectra.

Figure 2:
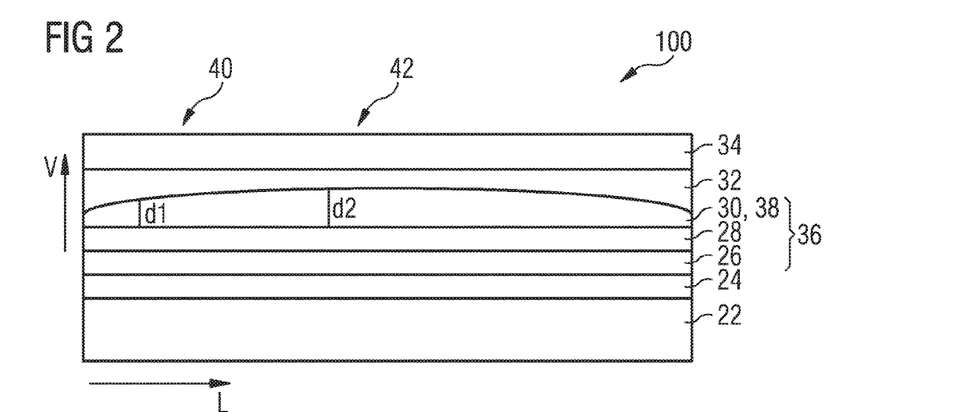
FIG. 2 shows a schematic representation of an organic light-emitting device according to a first exemplary embodiment.

FIG. 2 shows a schematic representation of an organic light-emitting device according to a first exemplary embodiment. The organic light-emitting device designated 100 as a whole has a transparent substrate 22, on which a large-scale, transparently formed anode 24 is arranged. Arranged on the anode 24 is an organic functional layer stack 36 with different organic functional layers, which in the exemplary embodiment shown comprises a hole transport layer 26, an organic light-emitting layer 28 and an electron transport layer 30. The electron transport layer 30 in the present exemplary embodiment is formed as an inhomogeneity layer 38, which has a thickness varying in a lateral direction L. The thickness of the inhomogeneity layer 38 is understood in particular to mean the diameter of the inhomogeneity layer in a vertical direction V. The thickness of the inhomogeneity layer 38 varies in this case gradually over the entire lateral extension of the device 100. For example, the inhomogeneity layer 38 has in an edge region 40 of the device 199 a thickness d1 that is smaller than a thickness d2 in a central region 42 of the device 100.

Arranged on the electron transport layer 30 formed as an inhomogeneity layer 38 is a reflectively formed cathode 32. An encapsulation layer 34 is provided on the entire layer sequence 24, 36, 32.

Due to the laterally varying thickness of the inhomogeneity layer 38, the vertical distance of the organic light-emitting layer 28 from the reflectively formed cathode 32 also changes. In the exemplary embodiment shown here, the distance between the organic light-emitting layer 28 and the cathode 32 corresponds precisely to the thickness of the inhomogeneity layer 38 and is d1 in the edge region 40 of the device and d2 in the central region 42 of the device, for example. In this way light is radiated over the entire extension of the device 100, which light corresponds to a combination of individual spectra and thus has an enhanced Color Rendering Index (cf. FIG. 1).

Figure 3:
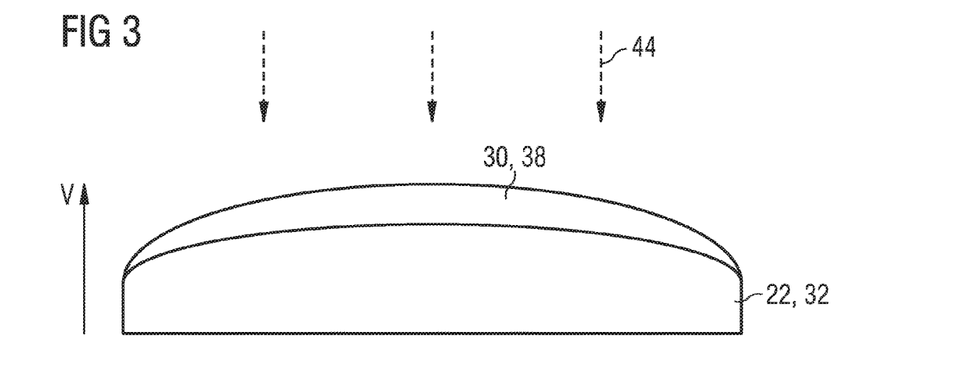
FIG. 3 shows a method for the production of an inhomogeneity layer according to a first exemplary embodiment.

FIG. 3 shows a method for the production of the inhomogeneity layer 38 according to a first exemplary embodiment. In this case a substrate 22 is provided, which is formed unevenly and the thickness of which varies laterally. A reflectively formed cathode 32 (not shown separately) has already been applied to the substrate 22 shown in FIG. 3. The organic functional layers are deposited in the following by vapor deposition, preferably by physical vapor deposition. One of the layers of the organic functional layer stack, for example the electron transport layer 30, is deposited on the uneven substrate 22 in that a material flow 44 occurring in the vapor deposition acts in the vertical direction V, due to which an inhomogeneity layer 38 is formed in the sense of the present invention. This is attributable to the fact that the surface contour of the substrate 22 is at least partially transferred to the layers arranged above it and in general more material is deposited in those regions in which the surface is perpendicular to the material flow 44, while in other regions in which the material flow 44 occurs at a flatter angle, less material is deposited by comparison. This means more precisely that locally different angles result, as a function of the surface structure, between the material flow 44 and the respective surface on which the material of the material flow 44 is deposited, so that the deposition rate varies laterally.

Homogeneous layer thicknesses can be produced approximately, on the other hand, due to the fact that the angle between the material flow occurring in the vapor deposition and the vertical direction V is either varied successively or the material flow runs in several directions simultaneously.

The thickness of the substrate 22 can vary, for example, by more than 5 μm. More precisely, an elevation is formed on the substrate that has a height of more than 5 μm.

FIGS. 4-7 show a method for the production of an inhomogeneity layer according to a second exemplary embodiment.

Figure 4:
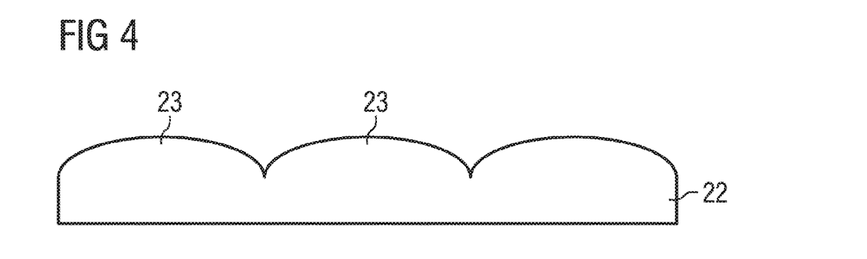
FIGS. 4 to 7 show a method for the production of an inhomogeneity layer according to a first exemplary embodiment.

In the method step shown in FIG. 4, a substrate 22 is provided, which has a plurality of periodically arranged elevations 23, which are offset laterally from one another and have a spacing of more than 5 μm. On its surface facing the functional layer stack, the substrate 22 preferably has an uneven surface structure, in which the structures are preferably greater than the coherence length L of the visible light, so that no interference effects occur. In particular, $L=2 \ln(2)*\lambda^2/(\pi*\Delta\pi*n)$).

In the following method steps, various layers are applied to the substrate 22, wherein layers of laterally varying thicknesses are produced as described above by vapor deposition using a vertically directed material flow.

Figure 5:
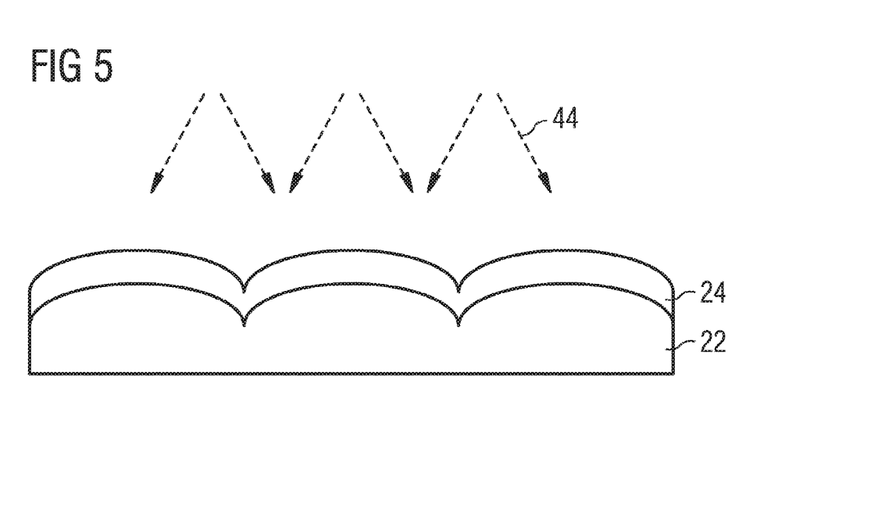

In the method step shown in FIG. 5, the transparent anode 24 is applied with a layer thickness that is as homogeneous as possible to the substrate 22, wherein various angles occur between the material flow 44 occurring in the vapor deposition and the vertical direction V, as described above.

Figure 6:
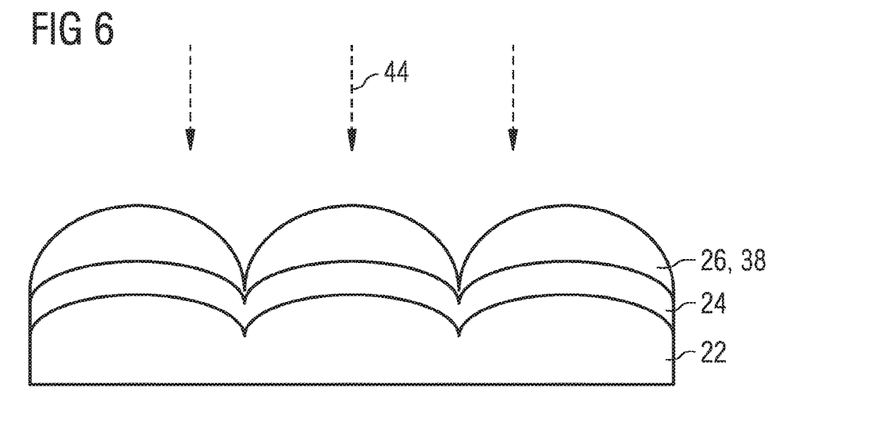

In the method step shown in FIG. 6, the hole transport layer 26 is produced using a material flow 44 occurring in the vertical direction, due to which it is formed with a laterally varying thickness and thus as an inhomogeneity layer 38 in the sense of the present invention.

Figure 7:
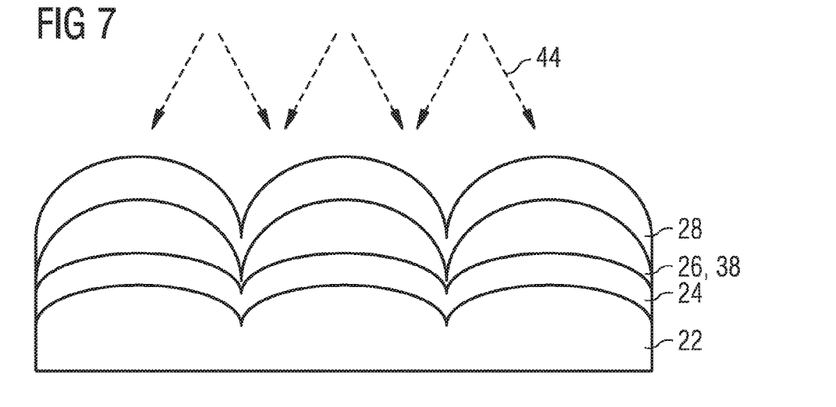

In the following method step shown in FIG. 7, the organic light-emitting layer 28 is applied with as homogeneous a thickness as possible using crossed material flows 44.

Figure 8:
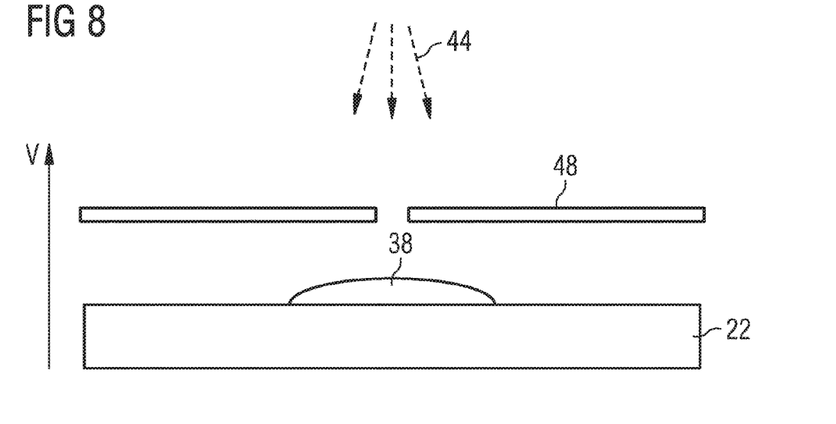
FIGS. 8 and 9 show a method for the production of an inhomogeneity layer according to a second exemplary embodiment.
Figure 9:
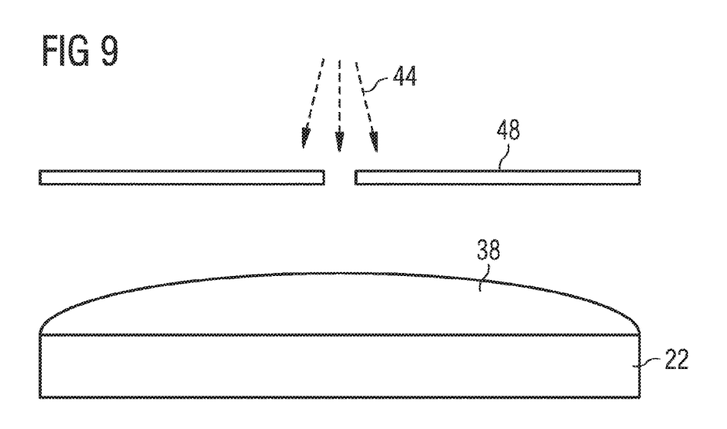

FIGS. 8 and 9 show a method for the production of an inhomogeneity layer according to a third exemplary embodiment. In this case, during the formation of the inhomogeneity layer 38, a shadow mask 48 used in the vapor deposition is moved in the vertical direction V, due to which various sub-regions of the inhomogeneity layer 38 to be formed are exposed to various portions of the material flow 44 occurring in the vapor deposition. A substrate 22 formed in a planar manner is preferably used, i.e. a substrate which does not have a targetedly introduced surface structuring. A material flow 44 is now advantageously generated that is not linear, but is directed into a finite solid angle field. This can be produced, for example, by a radially directed material source such as a crucible (not shown).

If the shadow mask 48 is located close to the substrate (FIG. 8), material is only deposited in a limited region. If the shadow mask 48 is now moved away from the substrate 22 in a vertical direction V during the vapor deposition, evaporation takes place increasingly behind the shadow mask 48 and ever larger regions are coated on the substrate 22 by this. The overlaying of the initially substantially sharp image of the shadow mask 48 with the material flow that is running out continuously wider results in a laterally varying layer thickness, due to which an inhomogeneity layer 38 in the sense of the present invention is formed.

An additional mask (not shown) can optionally be used that is arranged as close as possible to the substrate 22 during the entire process, in order to define an adequate definition of the outer edges of the inhomogeneity layer 38.

Figure 10:
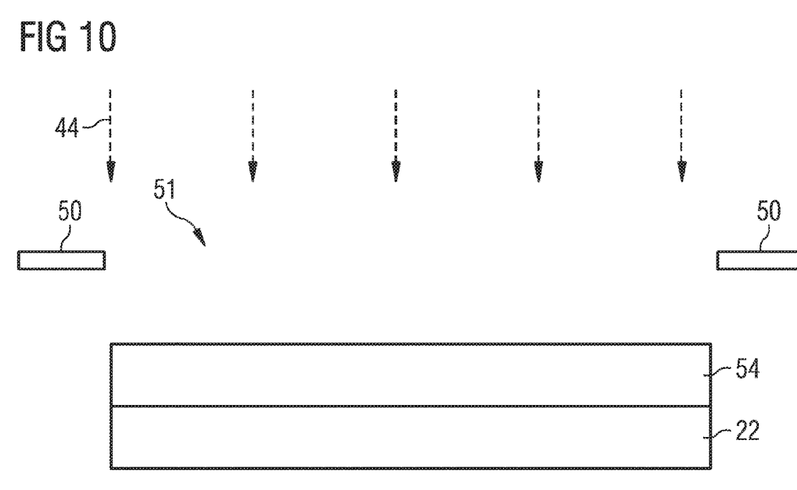
FIGS. 10 and 11 show a method for the production of an inhomogeneity layer according to a third exemplary embodiment.
Figure 11:
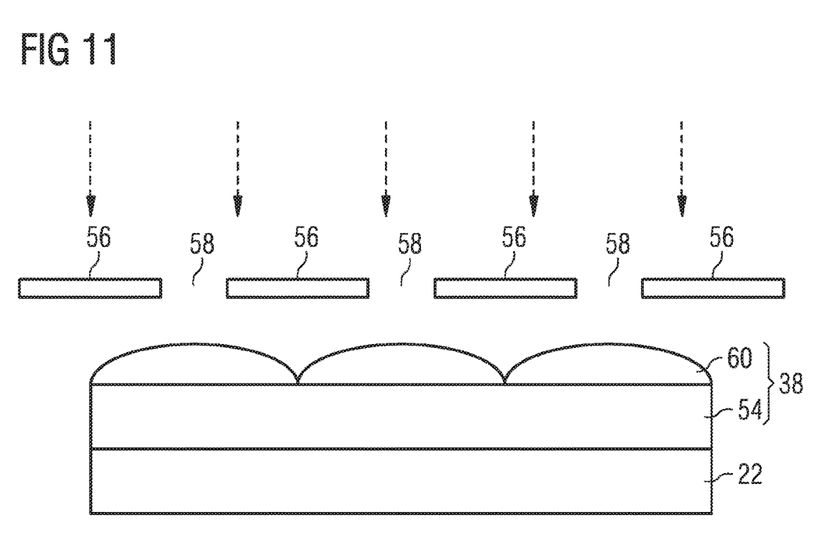

FIGS. 10 and 11 show a method for the production of the inhomogeneity layer 38 according to a fourth exemplary embodiment. In this case a first part of the inhomogeneity layer 38 is formed using a first mask 50, wherein the opening 51 of the first mask 50 is preferably as large as an active region of the device to be produced. When using a linearly directed material flow 44, a homogeneous partial layer 54 is produced by this. In the method step shown in FIG. 11, a second part of the inhomogeneity layer 38 is formed using a second mask 56, wherein the second mask 56 has a plurality of openings 58, which are each smaller than the opening 51 of the first mask 50, due to which local elevations 60 are produced on the first partial layer 54 and a lateral layer thickness variation occurs. For example, the electron transport layer or the hole transport layer can be formed in the manner described. The openings 58 in the second mask 56 can have a diameter, for example, of between 100 and 500 μm and be formed as a square, rectangle or circle.

In an exemplary embodiment of the method that is not shown, it is provided that during the formation of the inhomogeneity layer 38 a shadow mask used in the vapor deposition is moved in a lateral direction L, wherein the deposited quantity of material varies laterally in the region of the inhomogeneity layer 38 to be formed.

For example, a shadow mask, which is formed similarly to the mask 56 shown in FIG. 11 and has a plurality of openings, can be used. However, it is also possible to use a shadow mask with only one opening, for example (as shown in FIG. 9).

The lateral variation in the quantity of material deposited in the region of the inhomogeneity layer 38 can be achieved, for example, in that the shadow mask is moved laterally at a constant deposition rate at a temporally variable speed, or in that the deposition rate is varied timewise, while the shadow mask is moved at a constant speed relative to the substrate. However, combinations of said measures are conceivable.

The necessity of previously producing a homogeneous partial layer, as shown in FIG. 10 (see partial layer 54 there), is eliminated when moving the shadow mask in a lateral direction, since in general an adequate quantity of material can be deposited in each sub-region of the inhomogeneity layer to be formed. However, it is also possible to form such a partial layer in a separate, previous method step.

The invention is not restricted by the description with reference to the exemplary embodiment to these. On the contrary, the invention comprises every new feature and every combination of features, which includes in particular every combination of features in the claims, even if this feature or this combination itself is not explicitly indicated in the claims or exemplary embodiments.

The invention claimed is:

1. An organic light-emitting device comprising:
   an uneven substrate having a surface that varies continuously periodically in a lateral direction; and
   at least one layer sequence arranged on the substrate and suitable for generating electromagnetic radiation, the at least one layer sequence comprising:
   at least one first electrode surface arranged on the substrate;
   at least one second electrode surface arranged on the first electrode surface; and
   an organic functional layer stack with organic functional layers between the first electrode surface and the second electrode surface, wherein the organic functional layer stack comprises a plurality of light-emitting layers, wherein the light-emitting layers are configured to generate electromagnetic radiation from wavelength ranges that are different from one another, wherein the organic functional layer stack comprises at least one inhomogeneity layer, wherein a thickness of the inhomogeneity layer varies continuously periodically in the lateral direction, and wherein more material of the inhomogeneity layer is disposed in regions in which the surface of the substrate is perpendicular to a vertical direction, while less material is disposed in other regions, in which the surface of the substrate is not perpendicular to the vertical direction.

2. The device according to claim 1, wherein the thickness of the inhomogeneity layer varies by at least 5 nm.

3. The device according to claim 1, wherein the thickness of the inhomogeneity layer varies continuously.

4. The device according to claim 1, wherein the first electrode surface or the second electrode surface is reflective, and wherein the inhomogeneity layer is arranged between a light-emitting layer and the first or second electrode surface.

5. The device according to claim 1, wherein the inhomogeneity layer is an organic hole conducting layer or an organic electron conducting layer.

6. The device according to claim 1, wherein a plurality of light-emitting layers is arranged between the first electrode surface and the second electrode surface, and wherein the light-emitting layers are configured to generate electromagnetic radiation from wavelength ranges that are different from one another.

7. The device according to claim 1, wherein a thickness of the substrate varies in the lateral direction.

8. The device according to claim 1, wherein the inhomogeneity layer is different from the light-emitting layers.

9. The device according to claim 1, wherein a thickness of the substrate varies in the lateral direction by more than 200 nm.

10. A method for producing an organic light-emitting device, the method comprising:
providing an uneven substrate having a surface that varies continuously periodically in a lateral direction; and
applying a layer sequence suitable for generating electromagnetic radiation to the substrate, wherein applying the layer sequence comprises applying at least one first electrode surface on the substrate, applying at least one second electrode surface on the first electrode surface, and forming an organic functional layer stack with an organic functional layers between the first electrode surface and the second electrode surface,
wherein the organic functional layer stack comprises a plurality of light-emitting layers, wherein the light-emitting layers are configured to generate electromagnetic radiation from wavelength ranges that are different from one another, wherein the organic functional layer stack comprises at least one inhomogeneity layer,
wherein a thickness of the inhomogeneity layer varies continuously periodically in the lateral direction, and
wherein the inhomogeneity layer is formed by depositing a material layer such that a vertical material flow occurs so that the inhomogeneity layer comprises more material in regions in which the surface of the substrate is perpendicular to a vertical direction, while less material is deposited in other regions, in which the surface of the substrate is not perpendicular to the vertical direction.

11. The method according to claim 10, wherein a thickness of the substrate varies in the lateral direction, and wherein the organic functional layer stack is applied to the substrate in such a way that the inhomogeneity layer is formed.

12. The method according to claim 10, wherein forming the organic functional layer stack comprises forming the organic functional layer stack at least partially by vapor deposition.

13. The method according to claim 12, further comprising varying an angle between a material flow occurring in the vapor deposition and a vertical direction.

14. The method according to claim 12, further comprising moving a shadow mask in the vertical direction or the lateral direction while forming the inhomogeneity layer.

15. The method according to claim 12, wherein a first part of the inhomogeneity layer is formed using a first mask with at least a first opening and a second part of the inhomogeneity layer is formed using a second mask with a plurality of second openings, the second openings are smaller than the first opening.

16. The method according to claim 10, wherein a thickness of the substrate varies in the lateral direction by more than 200 nm, and wherein the organic functional layer stack is applied to the substrate in such a way that the inhomogeneity layer is formed.

17. An organic light-emitting device comprising:
a plane substrate; and
at least one layer sequence arranged on the substrate and suitable for generating electromagnetic radiation, the at least one layer sequence comprising:
at least one first electrode surface arranged on the substrate;
at least one second electrode surface arranged on the first electrode surface; and
an organic functional layer stack with organic functional layers between the first electrode surface and the second electrode surface, wherein the organic functional layer stack comprises a plurality of light-emitting layers, wherein the light-emitting layers are configured to generate electromagnetic radiation from wavelength ranges that are different from one another, wherein the organic functional layer stack comprises at least one inhomogeneity layer,
wherein a thickness of the inhomogeneity layer varies continuously periodically in a lateral direction, and
wherein the inhomogeneity layer is directly deposited on a plane layer of the organic functional layer stack.

* * * * *